US012563945B2

(12) United States Patent
Wang et al.

(10) Patent No.: US 12,563,945 B2
(45) Date of Patent: Feb. 24, 2026

(54) DISPLAY SUBSTRATES AND THEIR MANUFACTURING METHODS, AND DISPLAY DEVICES

(71) Applicants: Chengdu BOE Optoelectronics Technology Co., Ltd., Sichuan (CN); BOE Technology Group Co., Ltd., Beijing (CN)

(72) Inventors: Yunhao Wang, Beijing (CN); Peng Hou, Beijing (CN); Yongzhan Han, Beijing (CN); Yuan He, Beijing (CN); Can Huang, Beijing (CN); Zhen Li, Beijing (CN); Yulin Wang, Beijing (CN); Jiandong Bao, Beijing (CN); Pengcheng Zhao, Beijing (CN); Yide Du, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 38 days.

(21) Appl. No.: 17/779,799

(22) PCT Filed: May 19, 2021

(86) PCT No.: PCT/CN2021/094496
§ 371 (c)(1),
(2) Date: May 25, 2022

(87) PCT Pub. No.: WO2022/241661
PCT Pub. Date: Nov. 24, 2022

(65) Prior Publication Data
US 2024/0244932 A1     Jul. 18, 2024

(51) Int. Cl.
H10K 59/80 (2023.01)
H10K 59/12 (2023.01)
(Continued)

(52) U.S. Cl.
CPC ....... H10K 59/873 (2023.02); H10K 59/1201 (2023.02); H10K 59/122 (2023.02);
(Continued)

(58) Field of Classification Search
CPC .................................................. H10K 59/8731
See application file for complete search history.

(56) References Cited

U.S. PATENT DOCUMENTS 9,786,721 B1     10/2017 Tang
2003/0052869 A1*     3/2003 Fujii .................. G02F 1/133555
345/204

(Continued)

FOREIGN PATENT DOCUMENTS

CN          103531609 A          1/2014
CN          103996696 A          8/2014
(Continued)

OTHER PUBLICATIONS

PCT/CN2021/094496 international search report and written opinion.

*Primary Examiner* — Ajay Ojha
*Assistant Examiner* — Hajer Kolahdouzan
(74) *Attorney, Agent, or Firm* — IPro, PLLC

(57) ABSTRACT

The present application provides display substrates and their manufacturing methods, and display devices. A display substrate includes a base substrate, an encapsulation layer, a filter layer and optical film layers. The encapsulation layer is located on the base substrate. The filter layer is located in the encapsulation layer. The filter layer includes black matrixes. The black matrixes include black matrix openings. The optical film layers are located on a side of the encapsulation (Continued)

layer away from the base substrate. The optical film layers are configured to transmit part of incident light and absorb part of the incident light. A light transmittance of the optical film layers is larger than that of the black matrixes. The optical film layers include optical film layer openings. Projections of the optical film layer openings on the base substrate are located within projections of the black matrix openings on the base substrate.

20 Claims, 7 Drawing Sheets

(51) Int. Cl.
|     |     |
| --- | --- |
| *H10K 59/122* | (2023.01) |
| *H10K 59/126* | (2023.01) |
| *H10K 59/35* | (2023.01) |
| *H10K 59/38* | (2023.01) |

(52) U.S. Cl.
CPC ......... *H10K 59/126* (2023.02); *H10K 59/352* (2023.02); *H10K 59/353* (2023.02); *H10K 59/38* (2023.02); *H10K 59/8792* (2023.02); *H10K 59/8731* (2023.02)

(56) References Cited

U.S. PATENT DOCUMENTS

| | | | |
|---|---|---|---|
| 2014/0346477 A1 | 11/2014 | Chao et al. | |
| 2016/0300888 A1 | 10/2016 | Wang et al. | |
| 2018/0308903 A1* | 10/2018 | Jeong ................. | H10K 59/8791 |
| 2021/0098743 A1 | 4/2021 | Li et al. | |
| 2022/0005875 A1* | 1/2022 | Ahn ........................ | H10K 59/38 |
| 2022/0190045 A1* | 6/2022 | Lee ...................... | H10K 59/122 |

FOREIGN PATENT DOCUMENTS

| | | | | |
|---|---|---|---|---|
| CN | 205900543 U | 1/2017 | | |
| CN | 109742112 A | 5/2019 | | |
| CN | 110610978 A | 12/2019 | | |
| CN | 110911463 A | * 3/2020 | .......... | H01L 27/322 |
| CN | 111430423 A | 7/2020 | | |
| TW | 201445722 A | 12/2014 | | |

* cited by examiner

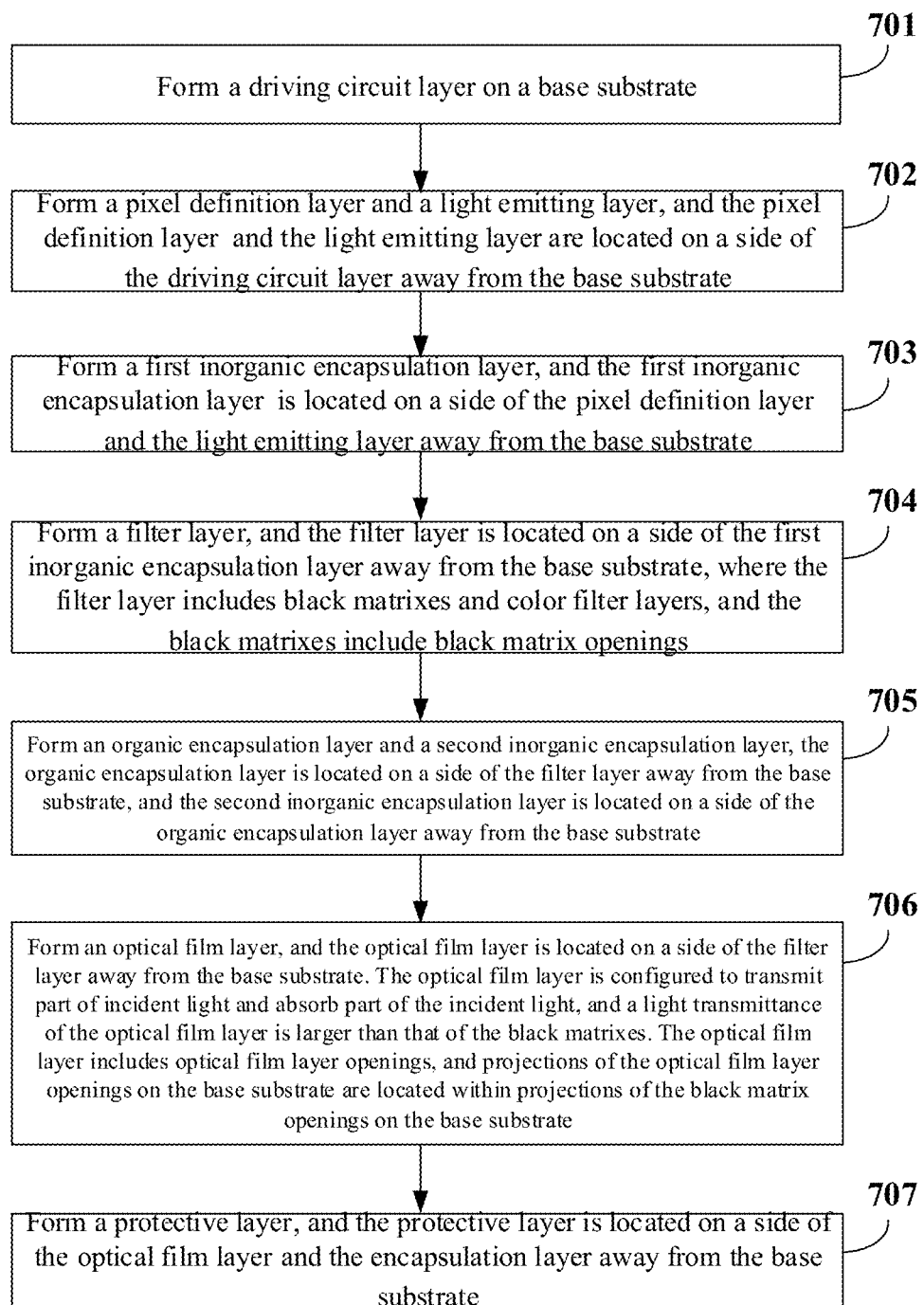

701

Form a driving circuit layer on a base substrate

702

Form a pixel definition layer and a light emitting layer, and the pixel definition layer and the light emitting layer are located on a side of the driving circuit layer away from the base substrate

703

Form a first inorganic encapsulation layer, and the first inorganic encapsulation layer is located on a side of the pixel definition layer and the light emitting layer away from the base substrate

704

Form a filter layer, and the filter layer is located on a side of the first inorganic encapsulation layer away from the base substrate, where the filter layer includes black matrixes and color filter layers, and the black matrixes include black matrix openings

705

Form an organic encapsulation layer and a second inorganic encapsulation layer, the organic encapsulation layer is located on a side of the filter layer away from the base substrate, and the second inorganic encapsulation layer is located on a side of the organic encapsulation layer away from the base substrate

706

Form an optical film layer, and the optical film layer is located on a side of the filter layer away from the base substrate. The optical film layer is configured to transmit part of incident light and absorb part of the incident light, and a light transmittance of the optical film layer is larger than that of the black matrixes. The optical film layer includes optical film layer openings, and projections of the optical film layer openings on the base substrate are located within projections of the black matrix openings on the base substrate

707

Form a protective layer, and the protective layer is located on a side of the optical film layer and the encapsulation layer away from the base substrate

FIG. 8

DISPLAY SUBSTRATES AND THEIR MANUFACTURING METHODS, AND DISPLAY DEVICES

CROSS-REFERENCE TO RELATED APPLICATIONS

The present application is a U.S. National Phase of International Application No. PCT/CN2021/094496, entitled "DISPLAY SUBSTRATES AND THEIR MANU-FACTURING METHODS, AND DISPLAY DEVICES", and filed on May 19, 2021. The entire contents of each of the above-listed applications are hereby incorporated by reference for all purposes.

TECHNICAL FIELD

The present application relates to the field of display technologies, and in particular, to display substrates and their manufacturing methods, and display devices.

BACKGROUND

In the related art, Organic Light Emitting Diodes (OLEDs) are active light emitting devices, which have advantages of self-luminescence, wide viewing angle, high contrast, low power consumption, extremely high response speed, etc. Therefore, they are widely applied to display panels.

The OLED display panels usually achieve an "all-in-one black" effect in a screen-off state by attaching polarizers to reduce reflectivity of ambient light. In order to be more integrated and reduce a thickness of the display panels, the polarizers are replaced by forming color filter films and black matrix structures directly on a thin film encapsulation layer, that is, COE (Color Film On Encapsulation) struc-tures.

However, when reflected light of ambient light encounters a gap between two adjacent black matrixes, a diffraction phenomenon will occur, which will lead to a phenomenon of a color halo surrounding a bright spot on a display panel, that is, to occurrence of a dark state color separation phenom-enon. How to alleviate the dark state color separation phenomenon is a technical problem that needs to be solved.

SUMMARY

The present disclosure provides display substrates and their manufacturing methods, and display devices.

According to a first aspect of examples of the present disclosure, there is provided a display substrate, including:
  a base substrate;
  a pixel definition layer located on the base substrate and including pixel definition layer openings;
  an encapsulation layer located on a side of the pixel definition layer away from the base substrate and including a first inorganic encapsulation layer, where the first inorganic encapsulation layer is located on the side of the pixel definition layer away from the base substrate;
  a filter layer located in the encapsulation layer and on a side of the first inorganic encapsulation layer away from the base substrate and including color filter layers, where the color filter layers include a first surface and a second surface, the first surface and the second surface are located on a side of the color filter layers facing the first inorganic encapsulation layer, a projection of the first surface on the base substrate is located within projections of the pixel definition layer openings on the base substrate, a projection of the second surface on the base substrate is located within a projection of the pixel definition layer on the base substrate, and the second surface is substantially parallel to a side surface of at least a part of the pixel definition layer.

In an example, the filter layer further includes black matrixes, and the black matrixes are located on a side of the color filter layers away from the first inorganic encapsula-tion layer.

In an example, the black matrixes include black matrix openings, and in a direction of the black matrixes pointing to the base substrate, a size of at least a part of the black matrix openings becomes larger.

In an example, the encapsulation layer further includes an organic encapsulation layer and a second inorganic encap-sulation layer: the organic encapsulation layer is located on a side of the filter layer away from the first inorganic encapsulation layer, and the second inorganic encapsulation layer is located on a side of the organic encapsulation layer away from the first inorganic encapsulation layer.

In an example, the encapsulation layer further includes an organic planarization layer, and the organic planarization layer is located between the filter layer and the organic encapsulation layer.

In an example, a thickness of the organic encapsulation layer is 2.0~12.0 microns, and a thickness of the organic planarization layer is 0.1~50.0 microns.

In an example, the display substrate further includes support posts located on the side of the pixel definition layer away from the base substrate, where projections of at least a part of the support posts on the base substrate are located within the projection of the pixel definition layer on the base substrate, and the first inorganic encapsulation layer is located on a side of the support posts away from the base substrate;
    the color filter layers further include a third surface, the third surface being substantially parallel to side sur-faces of at least a part of the support posts.

In an example, a slope angle of the third surface is larger than that of the second surface.

In an example, when the filter layer further includes the black matrixes, projections of interfaces between the color filter layers and the black matrixes on the base substrate are located within projections of the support posts on the base substrate.

In an example, a distance from surfaces of the black matrixes away from the base substrate to a surface of the base substrate facing the filter layer is larger than a distance from a surface of the color filter layers away from the base substrate to the surface of the base substrate facing the filter layer.

According to a second aspect of the examples of the present disclosure, there is provided a display substrate, including:
    a base substrate;
    an encapsulation layer located on the base substrate;
    a filter layer located in the encapsulation layer and includ-ing black matrixes, where the black matrixes include black matrix openings;
    optical film layers located on a side of the encapsulation layer away from the base substrate and configured to transmit part of incident light and absorb part of the incident light, where a light transmittance of the optical film layers is larger than that of the black matrixes, the optical film layers include optical film layer openings, and projections of the optical film layer openings on the base substrate are located within projections of the black matrix openings on the base substrate.

In an example, the light transmittance of the optical film layers is 30%~80%; and the light transmittance of the black matrixes is close to zero.

In an example, the optical film layers are black optical film layers.

In an example, the filter layer further includes color filter layers, and the projections of the black matrix openings on the base substrate are located within projections of the color filter layers on the base substrate.

In an example, the optical film layers are color optical film layers, and an optical film layer and a color filter layer whose projections on the base substrate have an overlapping area have a same color.

In an example, surfaces of the black matrixes facing the optical film layers are uneven.

In an example, the display substrate further includes a light emitting layer and a pixel definition layer, where the pixel definition layer is located between the base substrate and the encapsulation layer, and the pixel definition layer includes pixel definition layer openings;

the light emitting layer is located between the base substrate and the encapsulation layer, the light emitting layer includes sub-pixels, each sub-pixel includes a first electrode and an organic light emitting layer, and the organic light emitting layer is located on a side of the first electrode close to the encapsulation layer;

the pixel definition layer is located on the side of the first electrode close to the encapsulation layer, projections of organic light emitting layers on the base substrate are located within projections of the pixel definition layer openings on the base substrate, and projections of bottom surfaces of the pixel definition layer openings close to first electrodes on the base substrate are located within the projections of the optical film layer openings on the base substrate.

In an example, when the filter layer further includes color filter layers, a distance between bottom surfaces of the black matrixes close to the pixel definition layer and a surface of the base substrate facing the light emitting layer is larger than a distance between a bottom surface of the color filter layers close to the light emitting layer and the surface of the base substrate facing the light emitting layer.

In an example, the projections of the organic light emitting layers on the base substrate are located within projections of the first electrodes on the base substrate;

a gap exists between organic light emitting layers in two adjacent sub-pixels with a same light emission color, and a gap exists between adjacent color filter layers with a same color.

In an example, projections of the black matrixes on the base substrate are located within a projection of the pixel definition layer on the base substrate, or the projection of the pixel definition layer on the base substrate is located within the projections of the black matrixes on the base substrate.

In an example, the display substrate further includes support posts located between the pixel definition layer and the encapsulation layer, where projections of the support posts on the base substrate are located within a projection of the pixel definition layer on the base substrate.

In an example, when the filter layer further includes color filter layers, a distance between bottom surfaces of the black matrixes close to the pixel definition layer and a surface of the base substrate facing the light emitting layer is larger than a distance between a surface of the color filter layers close to the light emitting layer and the surface of the base substrate facing the light emitting layer.

In an example, when the filter layer further includes color filter layers, the projections of the bottom surfaces of the pixel definition layer openings close to first electrodes on the base substrate are located within the projections of the color filter layers on the base substrate.

In an example, the encapsulation layer includes a first inorganic encapsulation layer, an organic encapsulation layer and a second inorganic encapsulation layer, where the first inorganic encapsulation layer is located on the light emitting layer, the organic encapsulation layer is located on a side of the first inorganic encapsulation layer away from the light emitting layer, and the second inorganic encapsulation layer is located on a side of the organic encapsulation layer away from the light emitting layer;

the filter layer is located between the first inorganic encapsulation layer and the organic encapsulation layer, or the filter layer is located between the organic encapsulation layer and the second inorganic encapsulation layer.

In an example, a projection of the organic encapsulation layer on the base substrate is located within a projection of the first inorganic encapsulation layer on the base substrate, and within a projection of the second inorganic encapsulation layer on the base substrate.

In an example, the display substrate further includes a protective layer located on a side of the optical film layers away from the encapsulation layer.

In an example, the optical film layers are black optical film layers.

In an example, material for the optical film layers includes at least one of black metal, black organic material or black inorganic material.

In an example, when the material for the optical film layers includes the black metal, the material for the optical film layers includes molybdenum oxide.

In an example, the optical film layers are doped with a thallium element.

In an example, a thickness of the optical film layers is 10~55 nanometers.

In an example, the optical film layers include scattering particles.

In an example, material for the scattering particles is zirconium oxide, and a radius of the scattering particles is smaller than or equal to 100 nanometers: or, the material for the scattering particles is titanium dioxide, and the radius of the scattering particles is smaller than or equal to 200 nanometers.

In an example, a concentration of the scattering particles is smaller than or equal to 30%.

In an example, material for the optical film layers includes at least one of organic pigments or inorganic pigments.

In an example, a thickness of the optical film layers is 0.5~5.0 microns.

According to a third aspect of the examples of the present disclosure, there is provided a display device, including: a display module and a display substrate as described above.

BRIEF DESCRIPTION OF THE DRAWINGS

FIG. 8 is a schematic flowchart illustrating a method for manufacturing a display substrate according to an example of the present disclosure.

DETAILED DESCRIPTION OF THE EMBODIMENTS

Figure 1:
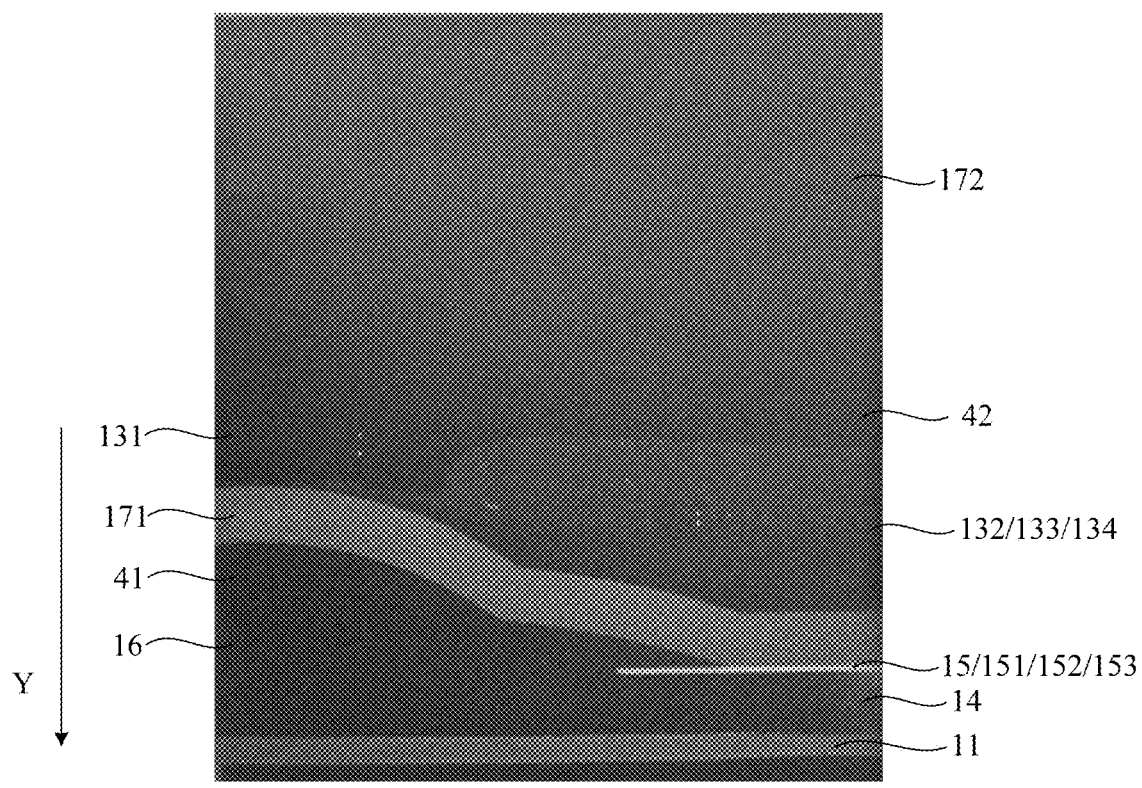
FIG. 1 is an electron micrograph illustrating a display substrate according to an example of the present disclosure.

In order to make the above objectives, features and advantages of the present disclosure more clearly understood, specific examples of the present disclosure will be described in detail below with reference to the accompanying drawings.

An example of the present disclosure provides a display substrate. The display substrate, as shown in FIG. 1, includes: a base substrate 11, a driving circuit layer 14, a light emitting layer 15, a pixel definition layer 16, support posts 41, an encapsulation layer and a filter layer.

In this example, as shown in FIG. 1, the driving circuit layer 14 is located on the base substrate 11. The pixel definition layer 16 is located on the base substrate 11, and the pixel definition layer 16 includes pixel definition layer openings.

In this example, as shown in FIG. 1, the light emitting layer 15 is located on a side of the driving circuit layer 14 away from the base substrate 11. The light emitting layer 15 may include pixel units arranged in an array, and each pixel unit may include at least one sub-pixel. In this example, each pixel unit may include three sub-pixels. In this example, each pixel unit may include a red sub-pixel, a green sub-pixel and a blue sub-pixel arranged in sequence. The red sub-pixel is used for emitting red light, the green sub-pixel is used for emitting green light, and the blue sub-pixel is used for emitting blue light.

In this example, each sub-pixel may be an OLED (Organic Light Emitting Diode) sub-pixel. Each sub-pixel may include a first electrode, an organic light emitting layer and a second electrode. The first electrode may be an anode, which is electrically connected to a pixel circuit, and the second electrode may be a cathode. The first electrode is located on a side of the driving circuit layer 14 away from the base substrate 11. The organic light emitting layer is located on a side of the first electrode close to the encapsulation layer. The second electrode is located on a side of the organic light emitting layer close to the encapsulation layer. The organic light emitting layer is located in a pixel definition layer opening, and a projection of the organic light emitting layer on the base substrate 11 may be located within a projection of the first electrode on the base substrate 11.

The second electrode may be a surface electrode, and all sub-pixels share the surface electrode, but are not limited thereto. The second electrode may be made of transparent conductive material. For example, the material for the second electrode may include at least one of metal or ITO (indium tin oxide).

In this example, the red sub-pixel includes a first organic light emitting layer 151 for emitting red light, the green sub-pixel includes a second organic light emitting layer 152 for emitting green light, and the blue sub-pixel includes a third organic light emitting layer 153 for emitting blue light. The above-mentioned organic light emitting layer may be the first organic light emitting layer 151, the second organic light emitting layer 152 or the third organic light emitting layer 153.

In this example, as shown in FIG. 1, the support posts 41 are located on a side of the pixel definition layer 16 away from the base substrate 11, and projections of at least a part of the support posts 41 on the base substrate 11 are located within a projection of the pixel definition layer 16 on the base substrate 11. The support posts 41 are used to support a fine metal mask (FMM) in evaporating the organic light emitting layer, which helps to make the fine metal mask under even stress, reduce the deformation of openings on the fine metal mask, and reduce the possibility of offsets of the filled organic light emitting layer. Therefore, it is beneficial to control the shape and coverage of the organic light emitting layer, and improve the yield.

In this example, the encapsulation layer is located on a side of the pixel definition layer 16 away from the base substrate 11. The filter layer is located in the encapsulation layer. In this way, a distance between the organic light emitting layer and the filter layer can be shortened, thereby achieving the purpose of increasing the viewing angle and alleviating the L-Decay (Luminance Decay).

In this example, as shown in FIG. 1, the encapsulation layer includes a first inorganic encapsulation layer 171, an organic planarization layer 42, an organic encapsulation layer 172, and a second inorganic encapsulation layer. The filter layer includes black matrixes 131 and color filter layers. The color filter layers include red filter layers 132, green filter layers 133 and blue filter layers 134. Only one of a red filter layer 132, a green filter layer 133 and a blue filter layer 134 is shown in FIG. 1.

In this example, as shown in FIG. 1, the first inorganic encapsulation layer 171 is located on a side of the support posts 41 away from the base substrate 11. The filter layer is located on a side of the first inorganic encapsulation layer 171 away from the base substrate. The organic planarization layer 42 is located between the filter layer and the organic encapsulation layer 172. The organic encapsulation layer 172 is located on a side of the first inorganic encapsulation layer 171 away from the base substrate 11. The second inorganic encapsulation layer 173 is located on a side of the organic encapsulation layer 172 away from the base substrate 11.

In this example, the organic planarization layer 42 functions to planarize and relieve stresses from the first inorganic encapsulation layer 171 and the second inorganic encapsulation layer 173 and protect the filter layer. A thickness of the organic planarization layer 42 may be 0.1~50.0 microns. For example, the thickness of the organic planarization layer 42 may be 0.1 microns, 3.0 microns, 10 microns, 20 microns, 30 microns, 40 microns or 50.0 microns. Preferably, the thickness of the organic planarization layer 42 is 3.0 microns.

In this example, the organic encapsulation layer 172 functions to relieve a stress between the first inorganic encapsulation layer 171 and the second inorganic encapsulation layer 173. A thickness of the organic encapsulation layer 172 may be 2.0~12.0 microns. For example, the thickness of the organic encapsulation layer 172 may be 2.0 microns, 6.0 microns, 8.0 microns, 10.0 microns or 12.0 microns. In this example, the thickness of the organic planarization layer 42 may be smaller than that of the organic encapsulation layer 172.

In this example, as shown in FIG. 1, the color filter layers include a first surface F1, a second surface F2 and a third surface F3. The first surface F1, the second surface F2 and the third surface F3 are located on a side of the color filter layers facing the first inorganic encapsulation layer 171. A projection of the first surface F1 on the base substrate 11 is located within a projection of the pixel definition layer opening on the base substrate 11. A projection of the second surface F2 on the base substrate 11 is located within a projection of the pixel definition layer 16 on the base substrate 11. For at least a part of the pixel definition layers 16, the second surface F2 is substantially parallel to a side surface of the pixel definition layer 16. The third surface F3 is substantially parallel to side surfaces of at least a part of the support posts 41.

In this example, as shown in FIG. 1, a slope angle of the third surface F3 is larger than that of the second surface F2. The slope angle of the second surface F2 may be an acute angle between the second surface F2 and a surface of the base substrate 11 facing the color filter layers. The slope angle of the third surface F3 may be an acute angle between the third surface F3 and a surface of the base substrate 11 facing the color filter layers.

In this example, as shown in FIG. 1, the black matrixes 131 are located on a side of the color filter layers away from the first inorganic encapsulation layer 171. A distance from a surface of a black matrix 131 away from the base substrate 11 to a surface of the base substrate 11 facing the filter layer is larger than a distance from a surface of a color filter layer away from the base substrate 11 to the surface of the base substrate 11 facing the filter layer. A distance from a surface of a black matrix 131 facing the base substrate 11 to the surface of the base substrate 11 facing the filter layer is larger than a distance from a surface of a color filter layer facing the base substrate 11 to the surface of the base substrate 11 facing the filter layer.

In this example, as shown in FIG. 1, projections of interfaces between the color filter layers and the black matrixes 131 on the base substrate 11 are located within projections of the support posts 41 on the base substrate 11.

In this example, as shown in FIG. 1, the black matrixes 131 include black matrix openings, and in a direction Y of the black matrixes 131 pointing to the base substrate 11, for at least a part of the black matrix openings, a size of the black matrix opening becomes larger. For example, for a part of the black matrix openings, a size of the black matrix opening becomes larger, or for all of the black matrix openings, a size of the black matrix opening becomes larger.

An example of the present disclosure provides a display substrate. The display substrate, as shown in FIG. 2, includes a base substrate 11, an encapsulation layer 17, a filter layer and an optical film layer 12.

Figure 2:
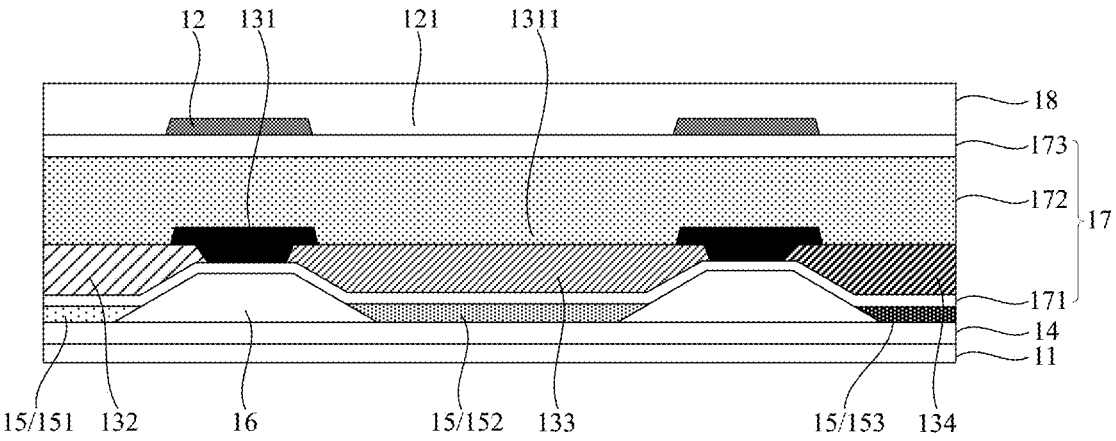
FIG. 2 is a schematic structural diagram illustrating a display substrate according to an example of the present disclosure.

In this example, as shown in FIG. 2, the encapsulation layer 17 is located on the base substrate 11, the filter layer is located in the encapsulation layer 17, and the filter layer includes black matrixes 131. The black matrixes 131 include black matrix openings 1311.

In this example, as shown in FIG. 2, the optical film layer 12 is located on a side of the encapsulation layer 17 away from the base substrate 11, and the optical film layer 12 is configured to transmit part of incident light and absorb part of the incident light. A light transmittance of the optical film layer 12 is larger than that of the black matrixes 131. The optical film layer 12 includes optical film layer openings 121, and projections of the optical film layer openings 121 on the base substrate 11 are located within projections of the black matrix openings 1311 on the base substrate 11.

In this example, the optical film layer 12 is located on the side of the encapsulation layer 17 away from the base substrate 11, the optical film layer 12 transmits part of the incident light, and the light transmittance of the optical film layer 12 is larger than that of the black matrixes 131. Therefore, when light incident from a black matrix 131 side encounters the optical film layer openings 121, no diffraction phenomenon will occur. The projections of the optical film layer openings 121 on the base substrate 11 are located within the projections of the black matrix openings 1311 on the base substrate 11, and the optical film layer 12 absorbs part of the incident light. Therefore, if light incident from a base substrate 11 side encounters the black matrix openings 1311 and is diffracted, a part of the diffracted light will be incident on the optical film layer 12, and a part of energy of the diffracted light incident on the optical film layer 12 will be absorbed by the optical film layer 12. Therefore, the diffracted light generated at the black matrix openings 1311 is weakened, and further a dark state color separation phenomenon can be alleviated.

The display substrates provided by the examples of the present disclosure have been briefly introduced above. The display substrates provided by the examples of the present disclosure will be introduced in detail below:

An example of the present disclosure provides a display substrate. The display substrate, as shown in FIG. 2, includes a base substrate 11, a driving circuit layer 14, a light emitting layer 15, a pixel definition layer 16, an encapsulation layer 17, a filter layer, an optical film layer 12 and a protective layer 18.

In this example, the base substrate 11 may be a rigid base substrate. In other examples, the base substrate 11 may be a flexible base substrate.

In this example, the base substrate 11 may be a transparent base, but is not limited thereto.

In this example, material for the base substrate 11 may be alkali-free glass or quartz. When the base substrate 11 is the flexible base substrate, the material for the base substrate 11 may include at least one of polyimide, polyethylene, polypropylene, polystyrene, polyethylene terephthalate or polyethylene naphthalate. For example, the material for the base substrate 11 may include polyimide, or both polyimide and polyethylene.

In this example, as shown in FIG. 2, the driving circuit layer 14 is located on the base substrate 11. The driving circuit layer 14 may include pixel circuits, and the pixel circuits are used for driving sub-pixels to emit light. The pixel circuits may be 1T pixel circuits. 2T1C pixel circuits. 3T1C pixel circuits. 4T1C pixel circuits. 6T1C pixel circuits. 7T1C pixel circuits. 8T1C pixel circuits or 8T2C pixel circuits, but are not limited thereto. The pixel circuits include thin film transistors, or both thin film transistors and capacitors. Each transistor may include a gate electrode, a source electrode, and a drain electrode. Material for the gate electrode, the source electrode and the drain electrode of the transistor may be metal. The pixel circuits have a current or voltage regulation function, and are used to control a luminous intensity of the sub-pixels.

In this example, as shown in FIG. 2, the light emitting layer 15 is located on a side of the driving circuit layer 14 away from the base substrate 11. The light emitting layer 15 includes pixel units arranged in an array, and each pixel unit may include at least one sub-pixel. In this example, each pixel unit may include three sub-pixels. In this example, each pixel unit may include a red sub-pixel, a green sub-pixel and a blue sub-pixel arranged in sequence. The red sub-pixel is used for emitting red light, the green sub-pixel is used for emitting green light, and the blue sub-pixel is used for emitting blue light. Of course, in other examples, the pixel unit may include a red sub-pixel, a green sub-pixel, a blue sub-pixel and a white sub-pixel, or the pixel unit may include only a white sub-pixel. The white sub-pixel is used for emitting white light.

In this example, each sub-pixel may be an OLED (Organic Light Emitting Diode) sub-pixel. Each sub-pixel may include a first electrode, an organic light emitting layer and a second electrode. The first electrode may be an anode, which is electrically connected to a pixel circuit, and the second electrode may be a cathode. The first electrode is located on a side of the driving circuit layer 14 away from the base substrate 11. The organic light emitting layer is located on a side of the first electrode close to the encapsulation layer. The second electrode is located on a side of the organic light emitting layer close to the encapsulation layer. A projection of the organic light emitting layer on the base substrate 11 is located within a projection of the first electrode on the base substrate 11. The second electrode may be a surface electrode, and all sub-pixels share the surface electrode, but are not limited thereto. The second electrode may be made of transparent conductive material. For example, the material for the second electrode may include at least one of metal or ITO (indium tin oxide).

In this example, the red sub-pixel includes a first organic light emitting layer 151 for emitting red light, the green sub-pixel includes a second organic light emitting layer 152 for emitting green light, and the blue sub-pixel includes a third organic light emitting layer 153 for emitting blue light. The above-mentioned organic light emitting layer may be the first organic light emitting layer 151, the second organic light emitting layer 152 or the third organic light emitting layer 153.

In this example, the pixel definition layer 16 is located on a side of the driving circuit layer 14 close to the encapsulation layer, and on a side of the first electrode close to the encapsulation layer. The pixel definition layer 16 includes pixel definition layer openings, and the organic light emitting layer is located in a pixel definition layer opening. A projection of the organic light emitting layer on the base substrate 11 is located within a projection of the pixel definition layer opening on the base substrate 11.

In this example, material for the pixel definition layer 16 may be transparent organic material. In other examples, the material for the pixel definition layer 16 may be black organic material, so that black matrixes 131 can be omitted, which simplifies the processes, and avoids the problem of residual black matrix material.

In this example, as shown in FIG. 2, the encapsulation layer 17 is located on a side of the light emitting layer 15 away from the base substrate 11 for preventing water and oxygen from eroding the sub-pixels and protecting the sub-pixels. The encapsulation layer 17 may be fabricated by Thin Film Encapsulation (TFE).

In this example, as shown in FIG. 2, the encapsulation layer 17 may include a first inorganic encapsulation layer 171, an organic encapsulation layer 172 and a second inorganic encapsulation layer 173. The first inorganic encapsulation layer 171 is located on a side of the light emitting layer 15 away from the base substrate 11. The organic encapsulation layer 172 is located on a side of the first inorganic encapsulation layer 171 away from the light emitting layer 15. The second inorganic encapsulation layer 173 is located on a side of the organic encapsulation layer 172 away from the light emitting layer 15.

In this example, a projection of the organic encapsulation layer 172 on the base substrate 11 is located within a projection of the first inorganic encapsulation layer 171 on the base substrate 11, and within a projection of the second inorganic encapsulation layer 173 on the base substrate 11. In this way, the first inorganic encapsulation layer 171 and the second inorganic encapsulation layer 173 are in contact at their edges to wrap the organic encapsulation layer 172, which can prevent water and oxygen from eroding the organic encapsulation layer 172. Therefore, the high-temperature and high-humidity storage reliability of the display substrate can be greatly improved, and the film layer separation phenomenon is not likely to occur during a bending test, which effectively ensures the static and dynamic reliability of the display substrate.

In this example, the first inorganic encapsulation layer 171 is used to block water and oxygen. Material for the first inorganic encapsulation layer 171 may include any one or combination of silicon oxynitride (SiOxNy), silicon nitride (SiNx), silicon oxide (SiOx) and aluminum oxide (AlOx). For example, the material for the first inorganic encapsulation layer 171 include silicon nitride, or silicon oxide, or both silicon oxynitride and silicon nitride, but are not limited thereto. The first inorganic encapsulation layer 171 may be fabricated by Plasma Enhanced Chemical Vapor Deposition (PECVD). Chemical Vapor Deposition (CVD). Atomic Layer Deposition (ALD) or hexamethyl disiloxane (HDMSO) plating.

In this example, a thickness of the first inorganic encapsulation layer 171 is 0.1~2.0 microns. For example, the thickness of the first inorganic encapsulation layer 171 may be 0.1 microns. 1.0 microns or 2.0 microns. If the thickness of the first inorganic encapsulation layer 171 is smaller than 0.1 microns, the effect of blocking water and oxygen is poor. If the thickness of the first inorganic encapsulation layer 171 is larger than 2.0 microns, the bending radius is large and the bending performance is poor. Therefore, when the thickness of the first inorganic encapsulation layer 171 is 0.1-2.0 microns, both the effect of blocking water and oxygen and the bending performance can be taken into consideration. Preferably, the thickness of the first inorganic encapsulation layer 171 is 1.0 microns.

In this example, the organic encapsulation layer 172 functions to relieve a stress between the first inorganic encapsulation layer 171 and the second inorganic encapsulation layer 173. Material for the organic encapsulation layer 172 may include at least one of thermocurable or photocurable organic material. For example, the material for the organic encapsulation layer 172 may include at least one of acrylates or epoxy resins. The organic encapsulation layer 172 may be fabricated by blade coating or Ink Jet Printing (IJP).

In this example, a thickness of the organic encapsulation layer 172 may be 2.0~12.0 microns. For example, the thickness of the organic encapsulation layer 172 may be 2.0 microns. 6.0 microns. 8.0 microns. 10.0 microns or 12.0 microns.

In this example, the second inorganic encapsulation layer 173 functions to block water and oxygen. Material for the second inorganic encapsulation layer 173 may include any one or combination of silicon oxynitride (SiOxNy), silicon nitride (SiNx), silicon oxide (SiOx) and aluminum oxide (AlOx). For example, the material for the second inorganic encapsulation layer 173 include silicon nitride, or silicon oxide, or both silicon oxynitride and silicon nitride, but are not limited thereto. Preferably, the material for the second inorganic encapsulation layer 173 include silicon nitride, which can improve the encapsulation performance due to its better compactness. The second inorganic encapsulation layer 173 may be fabricated by PECVD. CVD. ALD or HDMSO plating.

In this example, a thickness of the second inorganic encapsulation layer 173 may be 0.7-1.0 microns. For example, the thickness of the second inorganic encapsulation layer 173 may be 0.7 microns. 0.8 microns. 0.9 microns or 1.0 microns.

In this example, as shown in FIG. 2, the filter layer may be located in the encapsulation layer 17. In this way, a distance between the organic light emitting layer and the filter layer can be shortened, thereby achieving the purpose of increasing the viewing angle and alleviating the L-Decay (Luminance Decay).

In this example, since the filter layer is located in the encapsulation layer 17, a thickness of the display substrate will not be increased, and since the bending strain of the second inorganic encapsulation layer 173 is reduced, the small radius bending is realized, and the bending performance is improved.

It should be noted that high PPI (pixel density) display substrates and white light OLED display substrates may adopt a solution in which the filter layer is located in the encapsulation layer 17. The white light OLED display substrates refer to that the pixel unit includes only the white sub-pixel.

In this example, as shown in FIG. 2, the filter layer may be located between the first inorganic encapsulation layer 171 and the organic encapsulation layer 172. In this example, the organic encapsulation layer 172 can play the role of planarizing and protecting the filter layer. Of course, in other examples, the filter layer may be located between the organic encapsulation layer 172 and the second inorganic encapsulation layer 173.

In this example, as shown in FIG. 2, the filter layer may include black matrixes 131 and color filter layers. A black matrix 131 is located between two adjacent color filter layers, and are used to isolate the two adjacent color filter layers.

In this example, a thickness of the color filter layer is 1.0~4.0 microns. For example, the thickness of the color filter layer is 1.0 microns. 2.0 microns. 3.0 microns or 4.0 microns.

In this example, a thickness of the black matrix 131 is 0.7~1.5 microns. For example, the thickness of the black matrixes 131 is 0.7 microns. 1.0 microns or 1.5 microns.

In this example, as shown in FIG. 2, the color filter layer includes a red filter layer 132, a green filter layer 133 and a blue filter layer 134. A black matrix 131 is disposed between the red filter layer 132 and the green filter layer 133. A black matrix 131 is disposed between the green filter layer 133 and the blue filter layer 134. A black matrix 131 is disposed between the red filter layer 132 and the blue filter layer 134.

In this example, as shown in FIG. 2, a projection of a bottom surface of the pixel definition layer opening close to a first electrode on the base substrate 11 is located within a projection of the color filter layer on the base substrate 11.

In this example, as shown in FIG. 2, a projection of an organic light emitting layer on the base substrate 11 is located within the projection of the color filter layer on the base substrate 11. For example, a projection of the first organic light emitting layer 151 in the red sub-pixel on the base substrate 11 is located within a projection of a red filter layer 132 on the base substrate 11, a projection of the second organic light emitting layer 152 in the green sub-pixel on the base substrate 11 is located within a projection of a green filter layer 133 on the base substrate 11, and a projection of the third organic light emitting layer 153 in the blue sub-pixel on the base substrate 11 is located within a projection of a blue filter layer 134 on the base substrate 11.

Figure 3:
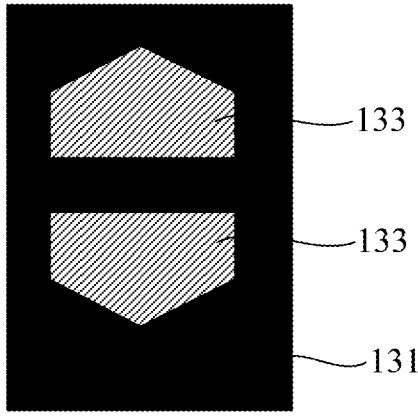
FIG. 3 is a schematic structural diagram illustrating another display substrate according to an example of the present disclosure.

In this example, as shown in FIG. 3, a gap exists between adjacent color filter layers with the same color. For example, when two green filter layers 133 are adjacent to each other, a gap exists between the two green filter layers 133, and a black matrix 131 is provided between the two green filter layers 133. In this way, the intensity of green diffracted light can be reduced, and further the dark-state color separation phenomenon can be alleviated.

In this example, as shown in FIG. 2, a projection of the black matrix 131 on the base substrate 11 is located within a projection of the pixel definition layer 16 on the base substrate 11. In other examples, the projection of the pixel definition layer 16 on the base substrate 11 may be located within the projection of the black matrix 131 on the base substrate 11.

In this example, as shown in FIG. 2, the black matrix 131 includes a black matrix opening 1311. A projection of the black matrix opening 1311 on the base substrate 11 is located within the projection of the color filter layer on the base substrate 11. A projection of bottom surface of the pixel definition layer opening close to first electrode on the base substrate 11 is located within a projection of the black matrix opening 1311 on the base substrate 11. In this way, reduction of a light emitting area can be avoided.

In this example, as shown in FIG. 2, a distance between the bottom surface of the black matrix 131 close to the pixel definition layer 16 and a surface of the base substrate 11 facing the light emitting layer 15 is larger than a distance between a bottom surface of the color filter layer close to the light emitting layer 15 and the surface of the base substrate 11 facing the light emitting layer 15. The structure of the filter layer can be fabricated by the following method: first fabricating a red filter layer 132, a green filter layer 133 and a blue filter layer 134, then forming a black matrix material layer on the red filter layer 132, the green filter layer 133 and the blue filter layer 134, and patterning the black matrix material layer to obtain the black matrixes 131. In the manufacturing method, residual of the black matrix material can be avoided by planarization processing the color filter layers, thus effectively ensure the light emitting area, and help to improve the yield and the optical performance.

In this example, the surface of the black matrix 131 facing the optical film layer 12 is uneven. In this way, diffracted light incident on the surface of the black matrix 131 facing the optical film layer 12 can be diffusely reflected, distribution of diffracted light of respective colors in the diffracted light can be disrupted, and further a dark state color separation phenomenon can be alleviated.

In this example, as shown in FIG. 2, the optical film layer 12 is located on a side of the encapsulation layer 17 away from the base substrate 11, and the optical film layer 12 is configured to transmit part of incident light and absorb part of the incident light. A light transmittance of the optical film layer 12 is larger than that of the black matrix 131. The optical film layer 12 includes optical film layer openings 121. A projection of the optical film layer opening 121 on the base substrate 11 is located within a projection of the black matrix opening 1311 on the base substrate 11.

In this example, the optical film layer 12 is located on the side of the encapsulation layer 17 away from the base substrate 11, the optical film layer 12 transmits part of the incident light, and the light transmittance of the optical film layer 12 is larger than that of the black matrixes 131. Therefore, when light incident from a black matrix 131 side encounters the optical film layer openings 121, no diffraction phenomenon will occur. The projection of the optical film layer opening 121 on the base substrate 11 is located within the projection of the black matrix opening 1311 on the base substrate 11, and the optical film layer 12 absorbs part of the incident light. Therefore, if light incident from a base substrate 11 side encounters the black matrix openings 1311 and is diffracted, a part of the diffracted light will be incident on the optical film layer 12, and part of energy of the diffracted light incident on the optical film layer 12 will be absorbed by the optical film layer 12. Therefore, the diffracted light generated at the black matrix openings 1311 is weakened, and further the dark state color separation phenomenon can be alleviated.

In this example, a projection of a bottom surface of the pixel definition layer opening close to the first electrode on the base substrate 11 is located within a projection of the optical film layer opening 121 on the base substrate 11. In this way, reduction of a light emitting area can be avoided, thereby affecting the light efficiency.

In this example, a light transmittance of the optical film layer 12 is 30%~80%. For example, the light transmittance of the optical film layer 12 may be 30%. 40%. 50%. 60%. 70% or 80%, but are not limited thereto. Preferably, the light transmittance of the optical film layer 12 is 70%. In this way, not only it can be ensured that when the light incident from the black matrix 131 side encounters the optical film layer openings 121, no diffraction phenomenon will occur, but also the absorptivity of the optical film layer 12 to the incident light can be appropriately increased, and the dark state color separation phenomenon can be significantly alleviated.

In this example, the optical film layer 12 is a black optical film layer. For example, material for the optical film layer 12 may include at least one of black metal, black organic material, or black inorganic material.

In this example, the material for the optical film layer 12 may include black metal. For example, the material for the optical film layer 12 may include molybdenum oxide (MoOx).

In this example, a thickness of the optical film layer 12 may be 10~55 nanometers. For example, the thickness of the optical film layer 12 may be 10 nanometers, 20 nanometers, 35 nanometers, 40) nanometers or 55 nanometers. A light transmittance of the optical film layer 12 is negatively related to its thickness. The larger the light transmittance of the optical film layer 12 is, the smaller its thickness is, and the smaller its light transmittance is, the larger its thickness is. The thickness of the optical film layer 12 may be determined according to its desired light transmittance.

In this example, the optical film layer 12 is doped with a thallium (Tl) element. In this way, the reflectivity of the optical film layer 12 can be reduced, which is beneficial to increase the light transmittance of the optical film layer 12, and further helps to alleviate the dark state color separation phenomenon.

In this example, as shown in FIG. 2, the protective layer 18 is located on a side of the optical film layer 12 away from the filter layer. The protective layer 18 is also located on a side of the encapsulation layer 17 away from the base substrate 11. Material for the protective layer 18 are transparent organic material. The protective layer 18 functions to protect the optical film layer 12.

In this example, a thickness of the protective layer 18 is 2.0~3.0 microns. For example, the thickness of the protective layer 18 is 2.0 microns, 2.5 microns or 3.0 microns.

An example of the present disclosure provides a display substrate. Different from the above examples, in this example, optical film layers 12 are color optical film layers.

Figure 4:
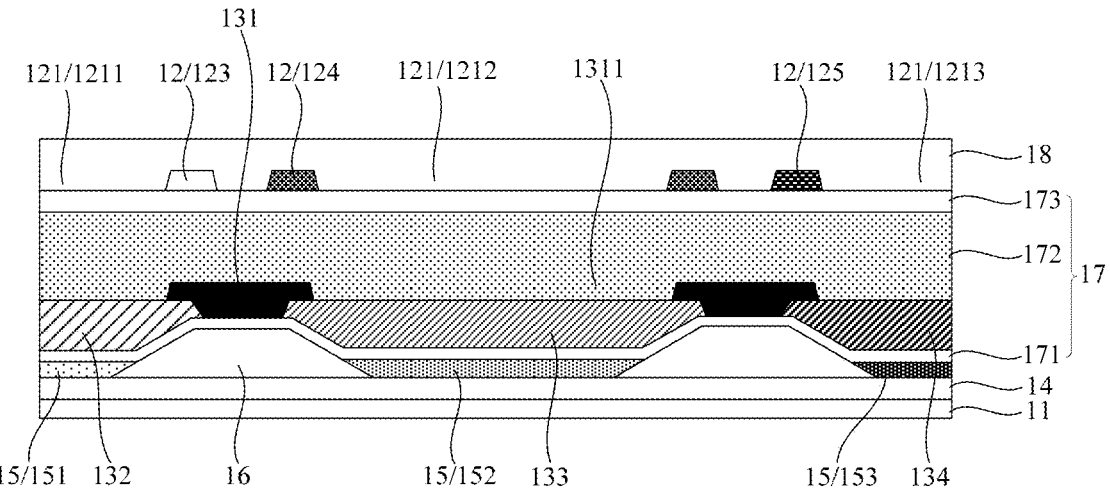
FIG. 4 is a schematic structural diagram illustrating another display substrate according to an example of the present disclosure.

In this example, as shown in FIG. 4, the color optical film layer may include a red optical film layer 123, a green optical film layer 124 and a blue optical film layer 125. The red optical film layer 123 allows red light to pass through, the green optical film layer 124 allows green light to pass through, and the blue optical film layer 125 allows blue light to pass through.

In this example, as shown in FIG. 4, the red optical film layer 123, the green optical film layer 124 and the blue optical film layer 125 each include corresponding optical film layer opening 121. For example, the red optical film layer 123 includes a red optical film layer opening 1211, the green optical film layer 124 includes a green optical film layer opening 1212, and the blue optical film layer 125 includes a blue optical film layer opening 1213.

In this example, as shown in FIG. 4, a projection of the red optical film layer opening 1211 on a base substrate 11 is located within a projection of the red filter layer 132 on the base substrate 11, a projection of the green optical film layer opening 1212 on the base substrate 11 is located within a projection of the green filter layer 133 on the base substrate 11, and a projection of the blue optical film layer opening 1213 on the base substrate 11 is located within a projection of the blue filter layer 134 on the base substrate 11.

In this example, as shown in FIG. 4, an optical film layer 12 and a color filter layer having an overlapping area of projection on the base substrate 11 have the same color. In this way, the optical film layer 12 can reduce an intensity of diffracted light with the same color as the color filter layer from a color filter layer side, thereby alleviating a dark state color separation phenomenon. For example, the projection of the red optical film layer 123 on the base substrate 11 and the projection of the red filter layer 132 on the base substrate 11 have an overlapping area, so that the red optical film layer 123 can reduce an intensity of red diffracted light incident from a red filter layer 132 side. The projection of the green optical film layer 124 on the base substrate 11 and the projection of the green filter layer 133 on the base substrate 11 have an overlapping area, so that the green optical film layer 124 can reduce an intensity of green diffracted light incident from a green filter layer 133 side. The projection of the blue optical film layers 125 on the base substrate 11 and the projection of the blue filter layers 134 on the base substrate 11 have an overlapping area, so that the blue optical film layers 125 can reduce an intensity of blue diffracted light incident from a blue filter layer 134 side.

In this example, material for the color optical film layers may include at least one of polymethyl methacrylate or silicone resin. For example, the material for the color optical film layers may include polymethyl methacrylate, or silicone resin, or both polymethyl methacrylate and silicone resin.

In this example, the material for the color optical film layer may include at least one of organic pigment or inorganic pigment. For example, the material for the color optical film layers may include organic pigment, or inorganic pigment, or both organic pigment and inorganic pigment. For example, material for the red optical film layer 123 may include red organic pigment, material for the green optical film layer 124 may include green organic pigment, and material for the blue optical film layer 125 may include blue organic pigment.

In this example, the optical film layer 12 may include scattering particles. In this way, diffracted light from a black matrix 131 side can be scattered, distribution of diffracted light with respective colors in the diffracted light can be disrupted, and further the dark state color separation phenomenon can be alleviated.

In this example, material for the scattering particles are zirconium oxide (ZrOx), and a radius of the scattering particles is smaller than 100 nanometers. In other examples, the radius of the scattering particles may be equal to 100 nanometers.

In another example, the material for the scattering particles may be titanium dioxide (TiO2), and the radius of the scattering particle may be smaller than 200 nanometers. In other examples, the radius of the scattering particle may be equal to 200 nanometers.

In this example, a concentration of scattering particles may be smaller than or equal to 30%. For example, the concentration of the scattering particles may be 5%, 10%, 20% or 30%.

In this example, a thickness of the optical film layer 12 may be 0.5~5.0 microns. For example, the thickness of the optical film layer 12 may be 0.5 microns, 1 micron, 1.5 microns, 3.0 microns, 4.0 microns or 5.0 microns. Preferably, the thickness of the optical film layer 12 may be 3.0 microns.

In this example, a light transmittance of the optical film layer 12 is negatively related to its thickness. The larger the light transmittance of the optical film layer 12 is, the smaller the thickness is, and the smaller the light transmittance of the optical film layers 12 is, the larger the thickness is. Therefore, the thickness of the optical film layer 12 can be determined according to the light transmittance of the optical film layer 12. The light transmittance of the optical film layer 12 can be determined according to requirements for L-Decay and color separation.

An example of the present disclosure provides a display substrate. Different from the above examples, in this example, as shown in FIG. 5, the display substrate further includes support posts 41.

Figure 5:
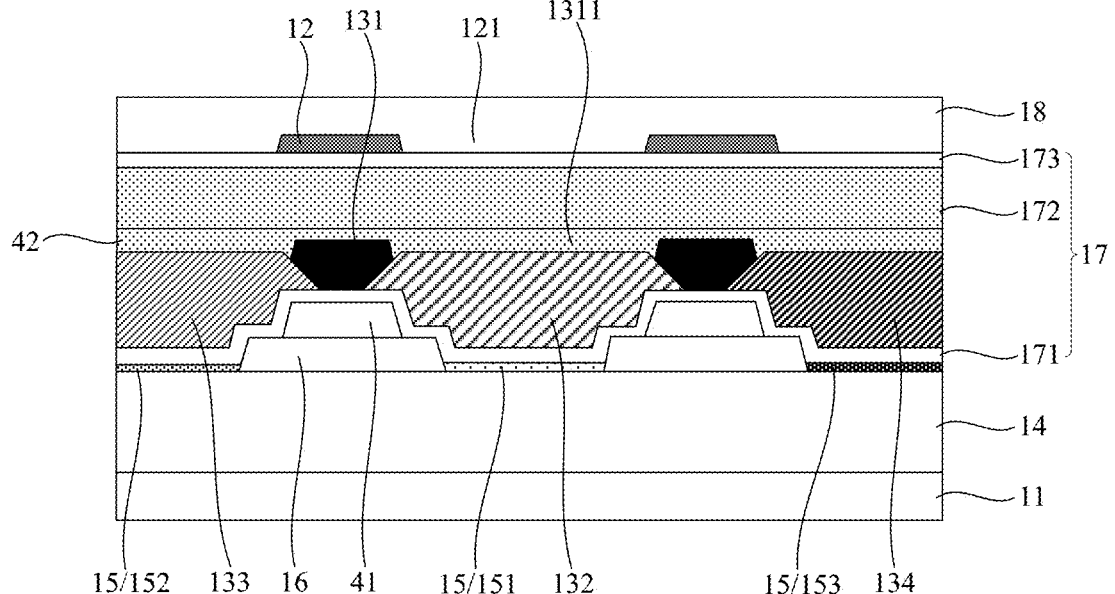
FIG. 5 is a schematic structural diagram illustrating another display substrate according to an example of the present disclosure.

In this example, as shown in FIG. 5, a support post 41 is disposed between a pixel definition layer 16 and an encapsulation layer 17. A projection of the support post 41 on a base substrate 11 is located within a projection of the pixel definition layer 16 on the base substrate 11. The support post 41 functions to support a fine metal mask (FMM) in evaporating organic light emitting layers, which helps to make the fine metal mask under even stress, reduce the deformation of openings on the fine metal mask, and reduce the possibility of offsets of the filled organic light emitting layer. Therefore, it is beneficial to control the shape and coverage of the organic light emitting layers, and improve the yield.

In this example, as shown in FIG. 5, the encapsulation layer 17 further includes an organic planarization layer 42, and the organic planarization layer 42 is located between a filter layer and an organic encapsulation layer 172. The organic planarization layer 42 functions to relieve stresses of a first inorganic encapsulation layer 171 and a second inorganic encapsulation layer 173 and thus protect the filter layer.

In this example, material for the organic planarization layer 42 is transparent material, and a light transmittance of the organic planarization layer 42 may be larger than 95%. For example, the light transmittance of the organic planarization layer 42 may be 98%, but is not limited to this.

In this example, the material for the organic planarization layer 42 may include at least one of thermocurable organic material or photocurable organic material.

In this example, the material for the organic planarization layer 42 may include at least one of acrylates or epoxy resins.

In this example, a thickness of the organic planarization layer 42 may be 0.1~50.0 microns. For example, the thickness of the organic planarization layer 42 may be 0.1 microns, 3.0 microns, 10 microns, 20 microns, 30 microns, 40 microns or 50.0 microns. Preferably, the thickness of the organic planarization layer 42 is 3.0 microns.

In this example, a projection of the organic planarization layer 42 on the base substrate 11 is located within a projection of the first inorganic encapsulation layer 171 on the base substrate 11, and within a projection of the second inorganic encapsulation layer 173 on the base substrate 11.

In this example, a distance between an edge of the projection of the organic planarization layer 42 on the base substrate 11 and an edge of the projection of the first inorganic encapsulation layer 171 on the base substrate 11 is 100 microns~1000 microns. For example, the distance between the edge of the projection of the organic planarization layer 42 on the base substrate 11 and the edge of the projection of the first inorganic encapsulation layer 171 on the base substrate 11 is 100 microns, 150 microns, 200 microns, 300 microns, 500 microns, 800 microns or 1000 microns. Preferably, the distance between the edge of the projection of the organic planarization layer 42 on the base substrate 11 and the edge of the projection of the first inorganic encapsulation layer 171 on the base substrate 11 is 200 microns. In this way, not only the first inorganic encapsulation layer 171 and the second inorganic encapsulation layer 173 can have a sufficient contact area to ensure an effective encapsulation distance, but also the organic planarization layer 42 can cover cathodes of sub-pixels to ensure the reliability of product display.

In this example, the material for the organic planarization layer 42 may be the same as that for the organic encapsulation layer 172.

Figure 6:
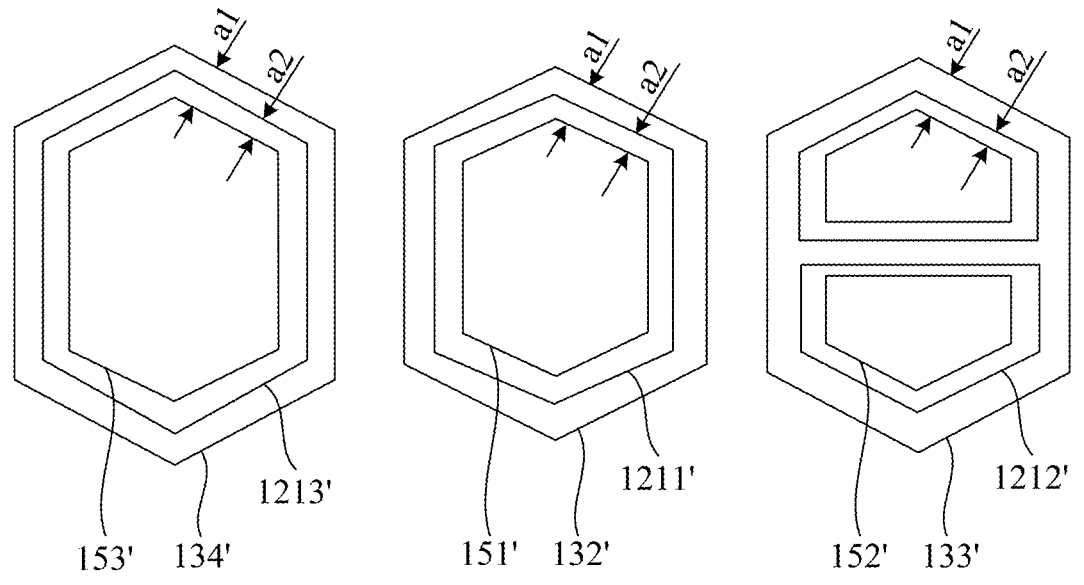
FIG. 6 is a schematic structural diagram illustrating another display substrate according to an example of the present disclosure.

In this example, in order to make illustration concise and clear, and ensure the accuracy of the illustration, FIG. 6 shows only a projection edge 132' of a red filter layer 132 on a base substrate 11, a projection edge 133' of a green filter layer 133 on the base substrate 11, a projection edge 134' of a blue filter layer 134 on the base substrate 11, a projection edge 151' of a first organic light emitting layer 151 on the base substrate 11, a projection edge 152' of a second organic light emitting layer 152 on the base substrate 11, a projection edge 153' of a third organic light emitting layer 153 on the base substrate 11, and projection edges 1211'. 1212'. 1213' of optical film layer openings 121 on the base substrate 11.

In this example, as shown in FIG. 6, a distance a1 between the projection edge 134' of the blue filter layer 134 on the base substrate 11 and the projection edge 153' of the third organic light emitting layer 153 on the base substrate 11 may be 0~12 microns. For example, the distance a1 between the projection edge 134' of the blue filter layer 134 on the base substrate 11 and the projection edge 153' of the third organic light emitting layer 153 on the base substrate 11 may be 0 micron. 4 microns. 6 microns or 12 microns.

Similarly, in this example, as shown in FIG. 6, a distance a1 between the projection edge 133' of the green filter layer 133 on the base substrate 11 and the projection edge 152' of the second organic light emitting layer 152 on the base substrate 11 may be (~12 microns. For example, the distance a1 between the projection edge 133' of the green filter layer 133 on the base substrate 11 and the projection edge 152' of the second organic light emitting layer 152 on the base substrate 11 may be 0) micron. 4 microns. 6 microns or 12 microns.

Similarly, in this example, as shown in FIG. 6, a distance a1 between the projection edge 132' of the red filter layer 132 on the base substrate 11 and the projection edge 151' of the first organic light emitting layer 151 on the base substrate 11 may be (~12 microns. For example, the distance a1 between the projection edge 132' of the red filter layer 132 on the base substrate 11 and the projection edge 151' of the first organic light emitting layer 151 on the base substrate 11 may be 0 micron. 4 microns. 6 microns or 12 microns.

In this example, as shown in FIG. 6, for the third organic light emitting layer 153 and an optical film layer opening 121 having an overlapping area of projection on the base substrate 11, a distance a2 between the projection edge 1213' of the optical film layer opening 121 on the base substrate 11 and the projection edge 153' of the third organic light emitting layer 153 on the base substrate 11 is −5~5 microns. For example, the distance a2 may be −5 microns. 0 micron or 5 microns. When a2 is larger than 0, the projection edge 1213' of the optical film layer opening 121 on the base substrate 11 is located on an outside of the projection edge 153' of the third organic light emitting layer 153 on the base substrate 11. When a2 is smaller than 0, the projection edge 1213' of the optical film layer opening 121 on the base substrate 11 is located on an inside of the projection edge 153' of the third organic light emitting layer 153 on the base substrate 11. When a2 is equal to 0, the projection edge 1213' of the optical film layer opening 121 on the base substrate 11 overlaps the projection edge 153' of the third organic light emitting layer 153 on the base substrate 11.

Similarly, in this example, as shown in FIG. 6, for the second organic light emitting layer 152 and an optical film layer opening 121 having an overlapping area of projection on the base substrate 11, a distance a2 between the projection edge 1212' of the optical film layer opening 121 on the base substrate 11 and the projection edge 152' of the second organic light emitting layer 152 on the base substrate 11 is −5~5 microns. For example, the distance a2 may be −5 microns. 0 micron or 5 microns. When a2 is larger than 0, the projection edge 1212' of the optical film layer opening 121 on the base substrate 11 is located on an outside of the projection edge 152' of the second organic light emitting layer 152 on the base substrate 11. When a2 is smaller than 0), the projection edge 1212' of the optical film layer opening 121 on the base substrate 11 is located on an inside of the projection edge 152' of the second organic light emitting layer 152 on the base substrate 11. When a2 is equal to 0, the projection edge 1212' of the optical film layer opening 121 on the base substrate 11 overlaps the projection edge 152' of the second organic light emitting layer 152 on the base substrate 11.

Similarly, in this example, as shown in FIG. 6, for the first organic light emitting layer 151 and an optical film layer opening 121 having an overlapping area of projection on the base substrate 11, a distance a2 between the projection edge 1211' of the optical film layer opening 121 on the base substrate 11 and the projection edge 151' of the first organic light emitting layer 151 on the base substrate 11 is −5~5 microns. For example, the distance a2 may be −5 microns. 0 micron or 5 microns. When a2 is larger than 0), the projection edge 1211' of the optical film layer opening 121 on the base substrate 11 is located on an outside of the projection edge 151' of the first organic light emitting layer 151 on the base substrate 11. When a2 is smaller than 0), the projection edge 1211' of the optical film layer opening 121 on the base substrate 11 is located on an inside of the projection edge 151' of the first organic light emitting layer 151 on the base substrate 11. When a2 is equal to 0, the projection edge 1211' of the optical film layer opening 121 on the base substrate 11 overlaps the projection edge 151' of the first organic light emitting layer 151 on the base substrate 11.

Figure 7:
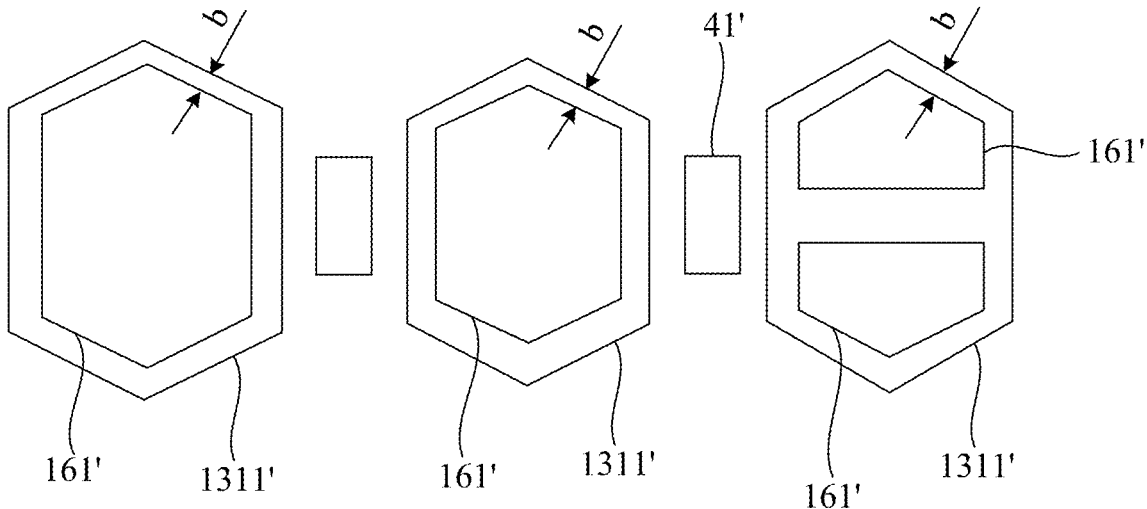
FIG. 7 is a schematic structural diagram illustrating another display substrate according to an example of the present disclosure.

In this example, in order to make illustration concise and clear, and ensure the accuracy of the illustration. FIG. 7 shows only projection edges 1311' of black matrix openings 1311 on a base substrate 11, projection edges 161' of pixel definition layer openings on the base substrate 11, and projection edges 41' of support posts 41 on the base substrate 11.

In this example, as shown in FIG. 7, a distance b between the projection edge 1311' of the black matrix opening 1311 on the base substrate 11 and the projection edge 161' of the pixel definition layer opening on the base substrate 11 is −2~12 microns. For example, the distance b between the projection edge 1311' of the black matrix opening 1311 on the base substrate 11 and the projection edge 161' of the pixel definition layer opening on the base substrate 11 is −2 microns, 0 microns, 3 microns, 5 microns, 8 microns, 10 microns or 12 microns. When b is a negative value, the projection edge 1311' of the black matrix opening 1311 on the base substrate 11 is located on outsides of the projection edge 161' of the pixel definition layer opening on the base substrate 11, so that projection of black matrix 131 on the base substrate 11 is located within a projection of a pixel definition layer 16 on the base substrate 11. When b is a positive value, the projection edge 1311' of the black matrix opening 1311 on the base substrate 11 is located on insides of the projection edge 161' of the pixel definition layer opening on the base substrate 11, so that the projection of the pixel definition layer 16 on the base substrate 11 is located within the projection of the black matrix 131 on the base substrate 11.

An example of the present disclosure provides a display device, including a display module, and a display substrate according to any of the above examples.

An example of the present disclosure provides a method for manufacturing a display substrate. The method for manufacturing a display substrate can be used to manufacture the display substrate shown in FIG. 2. The method for manufacturing the display substrate, as shown in FIG. 8, may include the following steps 701 to 707:

At the step 701, a driving circuit layer 14 is formed on a base substrate 11.

In this example, the driving circuit layer 14 may be fabricated on the base substrate 11 by exposing, developing, magnetron sputtering, dry etching, wet etching and other fabrication processes.

In this example, the driving circuit layer 14 may not include first electrodes (anodes) of sub-pixels.

At the step 702, a pixel definition layer 16 and a light emitting layer 15 are formed, and the pixel definition layer 16 and the light emitting layer 15 are located on a side of the driving circuit layer 14 away from the base substrate 11.

In this example, the light emitting layer 15 includes pixel units arranged in an array, and each pixel unit may include at least one sub-pixel. Each sub-pixel may include a first electrode, an organic light emitting layer and a second electrode.

In this example, first electrodes of sub-pixels may be first fabricated on the driving circuit layer 14, then the pixel definition layer 16 is fabricated, and next, organic light emitting layers and second electrodes are fabricated.

In this example, the pixel definition layer 16 with regular arrangement may be fabricated by photoresist coating, exposing, and developing. A thickness of the pixel definition layer 16 is 0.5~1.5 microns. For example, the thickness of the pixel definition layer 16 is 0.5 microns. 1.0 micron or 1.5 microns.

In this example, after the pixel definition layer 16 is fabricated, support posts 41 may be fabricated. A method for fabricating the support posts 41 includes coating the pixel definition layer 16 with a photoresist, and performing subsequent exposure and development to fabricate support posts 41 with regular arrangement. A thickness of the support posts 41 is 0.5~1.5 micrometers. For example, the thickness of the support posts 41 is 0.5 micrometers. 1.0 micrometer or 1.5 micrometers.

In this example, material for the support posts 41 may be the same as that for the pixel definition layer 16. A halftone mask is used for single exposure and development, and the fabricating is performed based on exposure energy difference of the regions.

In this example, after the support posts 41 are fabricated, the organic light emitting layers may be fabricated. For example, first organic light emitting layers 151, second organic light emitting layers 152, and third organic light emitting layers 153 may be filled into corresponding pixel definition layer openings by vacuum high-temperature evaporation, ink jet printing or transfer printing.

At the step 703, a first inorganic encapsulation layer 171 is formed, and the first inorganic encapsulation layer 171 is located on a side of the pixel definition layer 16 and the light emitting layer 15 away from the base substrate 11.

In this example, the first inorganic encapsulation layer 171 may be fabricated by PECVD, CVD, ALD or HDMSO plating.

At the step 704, a filter layer is formed, and the filter layer is located on a side of the first inorganic encapsulation layer 171 away from the base substrate 11, where the filter layer includes black matrixes 131 and color filter layers, and the black matrixes 131 include black matrix openings 1311.

In this example, the color filter layers may be formed first, then black matrix material layers are formed on a side of the color filter layers away from the base substrate 11, and the black matrix material layers are patterned to obtain the black matrix 131.

In this example, the color filter layers are formed first, and then the black matrixes 131 are fabricated. The color filter layers may be used for planarization processing, and black matrix material may be effectively cleaned to avoid a processing chamber pollution problem due to residual black matrix material, which reduces the cost of equipment maintenance.

In this example, material for fabricating the color filter layers may be effectively exposed and cleaned, which effectively ensures the consistency of processing parameters and design parameters, and greatly improves the yield.

In this example, problems of residual black matrix material in the pixel definition layer openings due to factors such as insufficient planarization, insufficient exposure depth, large discontinuity, and material affinity of the substrate below the filter layer, and partial peeling at positions of the support posts 41 can be effectively solved, and a light emitting area of sub-pixels can be effectively ensured, which avoids the reduction of luminance or service life of organic light emitting layers due to the reduction of the light emitting area.

In this example, material for the color filter layers may be negative photoresist. A method for forming the color filter layers includes coating with a negative photoresist, exposing, and developing to form green filter layers 133, red filter layers 132 and blue filter layers 134 in sequence. The order of forming the green filter layers 133, the red filter layers 132 and the blue filter layers 134 may not be limited to the above-mentioned order. In other examples, the material for the color filter layers may be organic resin material containing a thermal curing agent or a photosensitive curing agent, and the color filter layers may be fabricated by ink jet printing or transfer printing.

In this example, material for the black matrix 131 is negative photoresists. The black matrix material layers may be obtained by coating with a negative photoresist, and then the black matrix material layers are patterned by exposing and developing to obtain the black matrixes 131.

Figure 9:
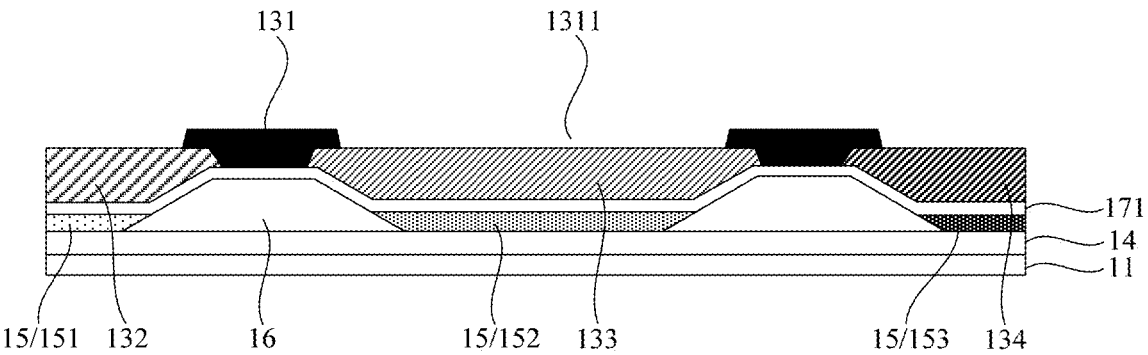
FIGS. 9 to 12 are schematic structural diagrams illustrating intermediate structures produced in the process of manufacturing a display substrate according to examples of the present disclosure.

In this example, after the step 704, an intermediate structure as shown in FIG. 9 can be obtained.

At the step 705, an organic encapsulation layer 172 and a second inorganic encapsulation layer 173 are formed, the organic encapsulation layer 172 is located on a side of the filter layer away from the base substrate 11, and the second inorganic encapsulation layer 173 is located on a side of the organic encapsulation layer 172 away from the base substrate 11.

In this example, before the organic encapsulation layer 172 and the second inorganic encapsulation layer 173 are formed, an organic planarization layer 42 may be formed first.

In this example, the organic planarization layer 42 may be fabricated by blade coating or ink jet printing, and then be cured by thermocuring or photocuring. When material for the organic planarization layer 42 includes thermocurable organic material, thermocuring may be used. When the material for the organic planarization layer 42 includes photocurable organic material, thermocuring may be used.

In this example, after the organic planarization layer 42 is formed, the organic encapsulation layer 172 is formed first, and then the second inorganic encapsulation layer 173 is formed. A method for fabricating the organic encapsulation layer 172 is the same as that for the organic planarization layer 42, and a method for fabricating the second inorganic encapsulation layer 173 is the same as that for the first inorganic encapsulation layer 171, which will not be repeated here.

Figure 10:
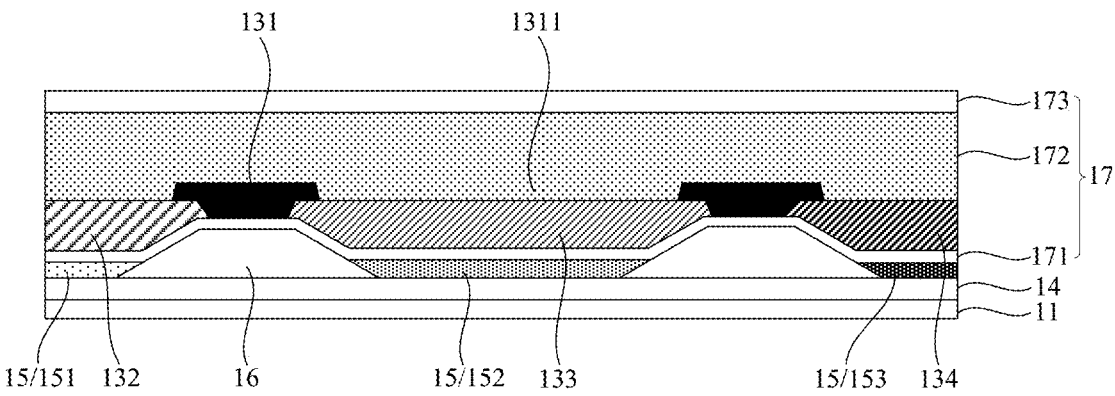

In this example, after the step 705, an intermediate structure as shown in FIG. 10 can be obtained.

At the step 706, an optical film layer 12 is formed, and the optical film layer 12 is located on a side of the filter layer away from the base substrate 11. The optical film layer 12 is configured to transmit part of incident light and absorb part of the incident light, and a light transmittance of the optical film layer 12 is larger than that of the black matrixes 131. The optical film layer 12 includes optical film layer openings 121, and projections of the optical film layer openings 121 on the base substrate 11 are located within projections of the black matrix openings 1311 on the base substrate 11.

In this example, material for the optical film layer 12 includes molybdenum oxide. In this example, an optical material film layer may be fabricated on a side of the encapsulation layer 17 away from the base substrate 11 by low-temperature deposition, and material for the optical material film layer includes molybdenum oxide. Then, the optical material film layer is patterned by a mask to obtain the optical film layer 12.

Figure 11:
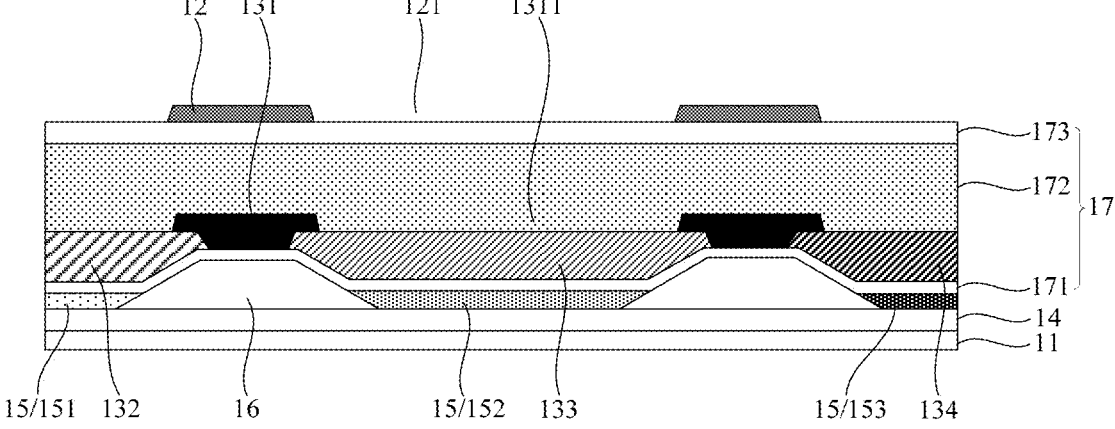

In this example, after the step 706, an intermediate structure as shown in FIG. 11 can be obtained.

At the step 707, a protective layer 18 is formed, and the protective layer 18 is located on a side of the optical film layer 12 and the encapsulation layer 17 away from the base substrate 11.

In this example, the protective layer 18 is formed on a side of the optical film layer 12 away from the base substrate 11.

In this example, after the step 707, the display substrate as shown in FIG. 2 can be obtained.

An example of the present disclosure provides a method for manufacturing a display substrate. The method for manufacturing a display substrate is used to manufacture the display substrate shown in FIG. 4.

In this example, steps 701 to 705 and 707 are the same as that in the above examples. Different from the above examples, at step 706, red optical film layers 123, green optical film layers 124 and blue optical film layers 125 may be fabricated respectively by three-time photoetching.

Figure 12:
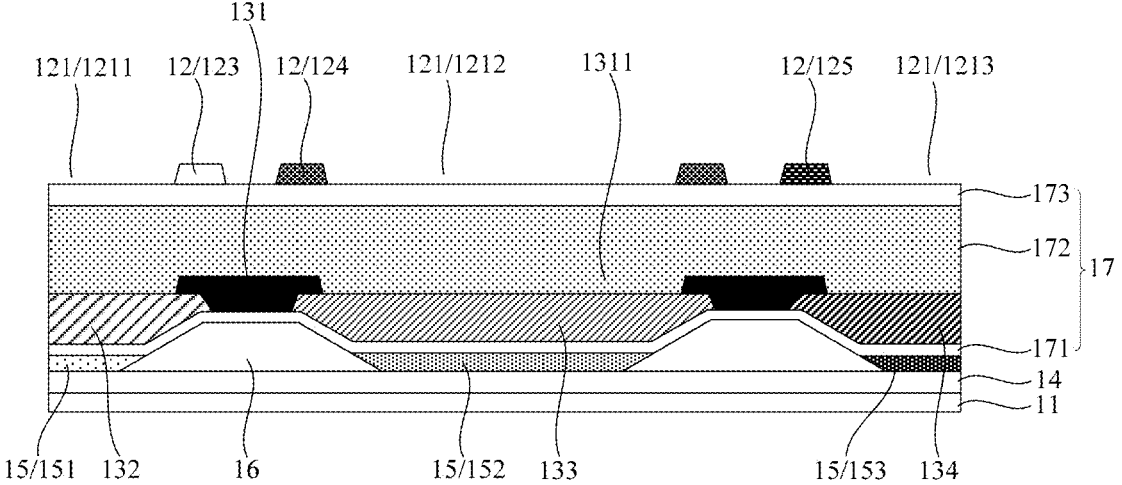

In this example, after the step 706, an intermediate structure as shown in FIG. 12 can be obtained.

It should be noted that the display device in the examples may be any product or component having a display function, such as electronic paper, a mobile phone, a tablet computer, a television, a notebook computer, a digital photo frame, or a navigator.

It should be noted that the contents in the above examples may be supplemented with each other.

Although the present disclosure is disclosed above, the present disclosure is not limited thereto. Any person skilled in the art can make various changes and modifications without departing from the spirit and scope of the present disclosure. Therefore, the protection scope of the present disclosure should be based on the scope defined by the claims.

The invention claimed is:

1. A display substrate, comprising:

a base substrate;

a pixel definition layer located on the base substrate, first openings being defined in the pixel definition layer;

support posts located on a side of the pixel definition layer away from the base substrate;

an encapsulation layer located on a side of the support posts away from the base substrate, the encapsulation layer comprising a first inorganic encapsulation layer, wherein the first inorganic encapsulation layer is located on the side of the pixel definition layer away from the base substrate; and a filter layer located in the encapsulation layer and on a side of the first inorganic encapsulation layer away from the base substrate, the filter layer comprising color filter layers, wherein the color filter layers comprise a first surface, a second surface and a third surface, the first surface, the second surface and the third surface are located on a side of the color filter layers facing the first inorganic encapsulation layer, a projection of the first surface on the base substrate is located within projections of the first openings on the base substrate, a projection of the second surface on the base substrate is located within a projection of the pixel definition layer on the base substrate, the second surface is substantially parallel to a side surface of at least a part of the pixel definition layer, and the third surface is substantially parallel to side surfaces of at least a part of the support posts, wherein the filter layer further comprises black matrixes, second openings are defined in the black matrixes, and at least a part of the second openings tapers in a direction away from the base substrate, and wherein a slope angle of the third surface is larger than a slope angle of the second surface, the slope angle of the second surface is an acute angle between the second surface and a surface of the base substrate facing the filter layer, and the slope angle of the third surface is an acute angle between the third surface and the surface of the base substrate facing the filter layer.

2. The display substrate according to claim 1, wherein the black matrixes are located on a side of the color filter layers away from the first inorganic encapsulation layer.

3. The display substrate according to claim 2, wherein a distance from surfaces of the black matrixes away from the base substrate to the surface of the base substrate facing the filter layer is larger than a distance from a surface of the color filter layers away from the base substrate to the surface of the base substrate facing the filter layer.

4. The display substrate according to claim 1, wherein the encapsulation layer further comprises an organic encapsulation layer and a second inorganic encapsulation layer; the organic encapsulation layer is located on a side of the filter layer away from the first inorganic encapsulation layer, and the second inorganic encapsulation layer is located on a side of the organic encapsulation layer away from the first inorganic encapsulation layer.

5. The display substrate according to claim 4, wherein the encapsulation layer further comprises an organic planarization layer, and the organic planarization layer is located between the filter layer and the organic encapsulation layer.

6. The display substrate according to claim 5, wherein a thickness of the organic encapsulation layer is 2.0~12.0 microns, and a thickness of the organic planarization layer is 0.1~50.0 microns.

7. The display substrate according to claim 1, wherein projections of interfaces between the color filter layers and the black matrixes on the base substrate are located within projections of the support posts on the base substrate.

8. A display device, comprising: a display module and a display substrate according to claim 1.

9. The display substrate according to claim 1, wherein a projection of the third surface on the base substrate is located within the projection of the pixel definition layer on the base substrate, and wherein projections of at least a part of the support posts on the base substrate are located within the projection of the pixel definition layer on the base substrate, and the first inorganic encapsulation layer is located on a side of the support posts away from the base substrate.

10. A display substrate, comprising:

a base substrate;

an encapsulation layer located on the base substrate;

a filter layer located in the encapsulation layer, the filter layer comprising black matrixes, wherein second openings are defined in the black matrixes;

optical film layers located on a side of the encapsulation layer away from the base substrate and configured to transmit part of incident light and absorb part of the incident light, wherein a light transmittance of the optical film layers is larger than that of the black matrixes, third openings are defined in the optical film layers, and boundaries of projections of the third openings on the base substrate are located within projections of the second openings on the base substrate.

11. The display substrate according to claim 10, wherein the light transmittance of the optical film layers is 30%~80%; and the light transmittance of the black matrixes is close to zero.

12. The display substrate according to claim 10, further comprising a light emitting layer and a pixel definition layer, wherein the pixel definition layer is located between the base substrate and the encapsulation layer, and first openings are defined in the pixel definition layer;

the light emitting layer is located between the base substrate and the encapsulation layer, the light emitting layer comprises sub-pixels, each sub-pixel comprises a first electrode and an organic light emitting layer, and the organic light emitting layer is located on a side of the first electrode close to the encapsulation layer;

the pixel definition layer is located on the side of the first electrode close to the encapsulation layer, projections of organic light emitting layers on the base substrate are located within projections of the first openings on the base substrate, and projections of bottom surfaces of the first openings close to first electrodes on the base substrate are located within the projections of the third openings on the base substrate.

13. The display substrate according to claim 12, wherein when the filter layer further comprises color filter layers, a distance between bottom surfaces of the black matrixes close to the pixel definition layer and a surface of the base substrate facing the light emitting layer is larger than a distance between a bottom surface of the color filter layers close to the light emitting layer and the surface of the base substrate facing the light emitting layer.

14. The display substrate according to claim 12, wherein the projections of the organic light emitting layers on the base substrate are located within projections of the first electrodes on the base substrate;

a gap exists between organic light emitting layers in two adjacent sub-pixels with a same light emission color, and a gap exists between adjacent color filter layers with a same color.

15. The display substrate according to claim 12, wherein projections of the black matrixes on the base substrate are located within a projection of the pixel definition layer on the base substrate, or the projection of the pixel definition layer on the base substrate is located within the projections of the black matrixes on the base substrate.

16. The display substrate according to claim 12, further comprising support posts located between the pixel definition layer and the encapsulation layer, wherein projections of the support posts on the base substrate are located within a projection of the pixel definition layer on the base substrate.

17. The display substrate according to claim 12, wherein when the filter layer further comprises color filter layers, the projections of the bottom surfaces of the first openings close to first electrodes on the base substrate are located within the projections of the color filter layers on the base substrate.

18. The display substrate according to claim 12, wherein the encapsulation layer comprises a first inorganic encapsulation layer, an organic encapsulation layer and a second inorganic encapsulation layer, wherein the first inorganic encapsulation layer is located on the light emitting layer, the organic encapsulation layer is located on a side of the first inorganic encapsulation layer away from the light emitting layer, and the second inorganic encapsulation layer is located on a side of the organic encapsulation layer away from the light emitting layer;

the filter layer is located between the first inorganic encapsulation layer and the organic encapsulation layer, or the filter layer is located between the organic encapsulation layer and the second inorganic encapsulation layer.

19. The display substrate according to claim 18, wherein a projection of the organic encapsulation layer on the base substrate is located within a projection of the first inorganic encapsulation layer on the base substrate, and within a projection of the second inorganic encapsulation layer on the base substrate.

20. The display substrate according to claim 10, wherein the filter layer further comprises color filter layers, and the black matrixes comprise extensions disposed on and in contact with a top surface of the color filter layers furthest away from the base substrate.

* * * * *